(12) United States Patent
Venezia et al.

(10) Patent No.: US 8,658,956 B2
(45) Date of Patent: Feb. 25, 2014

(54) TRENCH TRANSFER GATE FOR INCREASED PIXEL FILL FACTOR

(75) Inventors: Vincent Venezia, Sunnyvale, CA (US); Hsin-Chih Tai, San Jose, CA (US); Duli Mao, Sunnyvale, CA (US); Howard E. Rhodes, San Martin, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 866 days.

(21) Appl. No.: 12/582,585

(22) Filed: Oct. 20, 2009

(65) Prior Publication Data
US 2011/0089311 A1  Apr. 21, 2011

(51) Int. Cl.
*H01L 31/112* (2006.01)
(52) U.S. Cl.
USPC ........................................ 250/208.1; 257/222
(58) Field of Classification Search
USPC ............................ 250/208.1; 257/222, E31.073
See application file for complete search history.

(56) References Cited

U.S. PATENT DOCUMENTS

| | | | |
|---|---|---|---|
| 4,173,765 A | | 11/1979 | Heald et al. |
| 5,223,726 A | * | 6/1993 | Yamada et al. ............... 257/244 |
| 2004/0262609 A1 | | 12/2004 | Mouli et al. |
| 2006/0124976 A1 | * | 6/2006 | Adkisson et al. ............ 257/292 |
| 2006/0138486 A1 | | 6/2006 | Lim |
| 2006/0138493 A1 | | 6/2006 | Shim et al. |
| 2006/0145215 A1 | | 7/2006 | Paik et al. |
| 2008/0153193 A1 | * | 6/2008 | Lyu ................................. 438/59 |

FOREIGN PATENT DOCUMENTS

| | | |
|---|---|---|
| EP | 1562233 A2 | 8/2005 |
| EP | 2133918 A2 | 12/2009 |
| EP | 2216817 A1 | 8/2010 |

OTHER PUBLICATIONS

EP Application No. 10186795.0 Partial European Search Report mailed Feb. 2, 2011, 8 pages.
CN 201010521560.3; Second Chinese Office Action, issued Jul. 23, 2013, 17 pages.
EP Application No. 10186795.0, Extended European Search Report mailed Jul. 14, 2011, 14 pages.
CN 201010521560.3; First Chinese Office Action and Search Report, mailed Nov. 2, 2012, 15 pages.
EP Application No. 10186795.0, European Office Action mailed Nov. 25, 2013, 6 pages.
TW 099130963; ROC (Taiwan) First Office Action and Search Report issued Dec. 12, 2013, 17 pages.

\* cited by examiner

*Primary Examiner* — Seung C Sohn
(74) *Attorney, Agent, or Firm* — Blakely Sokoloff Taylor & Zafman LLP

(57) ABSTRACT

An image sensor provides high scalability and reduced image lag. The sensor includes a first imaging pixel that has a first photodiode region formed in a substrate of the image sensor. The sensor also includes a first vertical transfer transistor coupled to the first photodiode region. The first vertical transfer transistor can be used to establish an active channel. The active channel typically extends along the length of the first vertical transfer transistor and couples the first photodiode region to a floating diffusion.

19 Claims, 9 Drawing Sheets

(VIEW AA)

(VIEW BB)

(VIEW A-A)

(VIEW B-B)

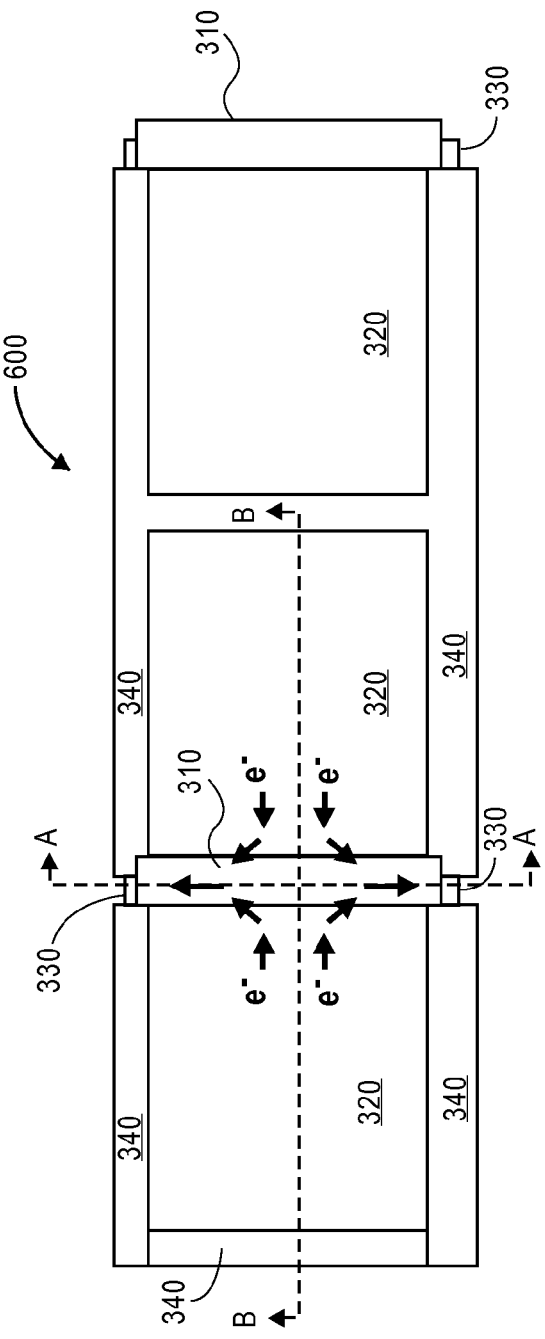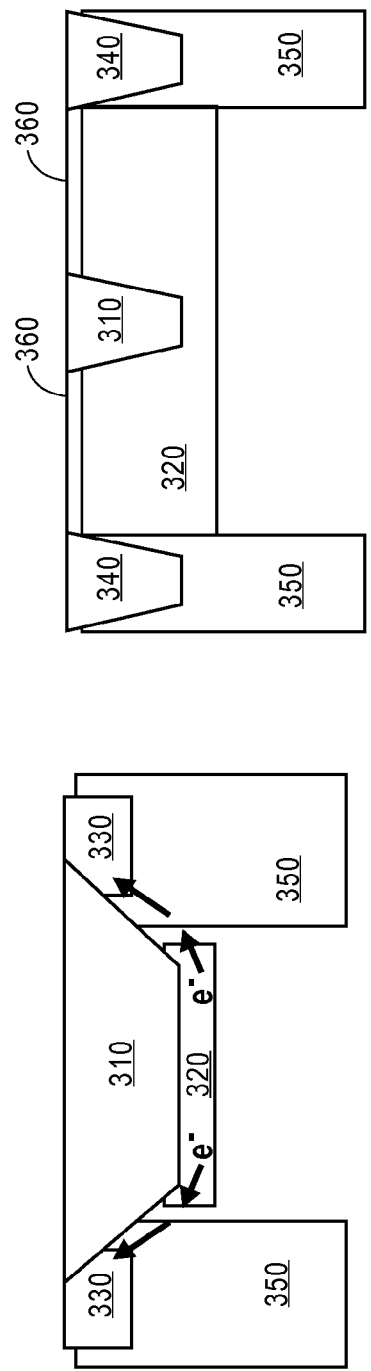

TRENCH TRANSFER GATE FOR INCREASED PIXEL FILL FACTOR

This disclosure relates generally to integrated circuits, and more particularly, but not exclusively, relates to integrated circuits for imaging.

BACKGROUND INFORMATION

Integrated circuits have been developed to reduce the size of components used to implement circuitry. For example, integrated circuits have been using ever-smaller design features, which reduces the region used to implement the circuitry, such that design features are now well under the wavelengths of visible light. With the ever-decreasing sizes of image sensors and the individual imaging pixels that are part of a sensing array, it is important to more efficiently capture incident light that illuminates the sensing array. Thus, more efficiently capturing incident light helps to maintain or improve the quality of electronic images captured by the sensing arrays of ever-decreasing sizes. The quality of an electronic image can be improved, for example, by reducing image lag. Image lag can be caused by charge in a photodiode region of a pixel that has not been removed from exposure to a previous image.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

FIGS. 6A, 6B and 6C illustrates of pixels having a shared vertical transfer gate and shared floating diffusion per pixel.

DETAILED DESCRIPTION

Figure 1A:
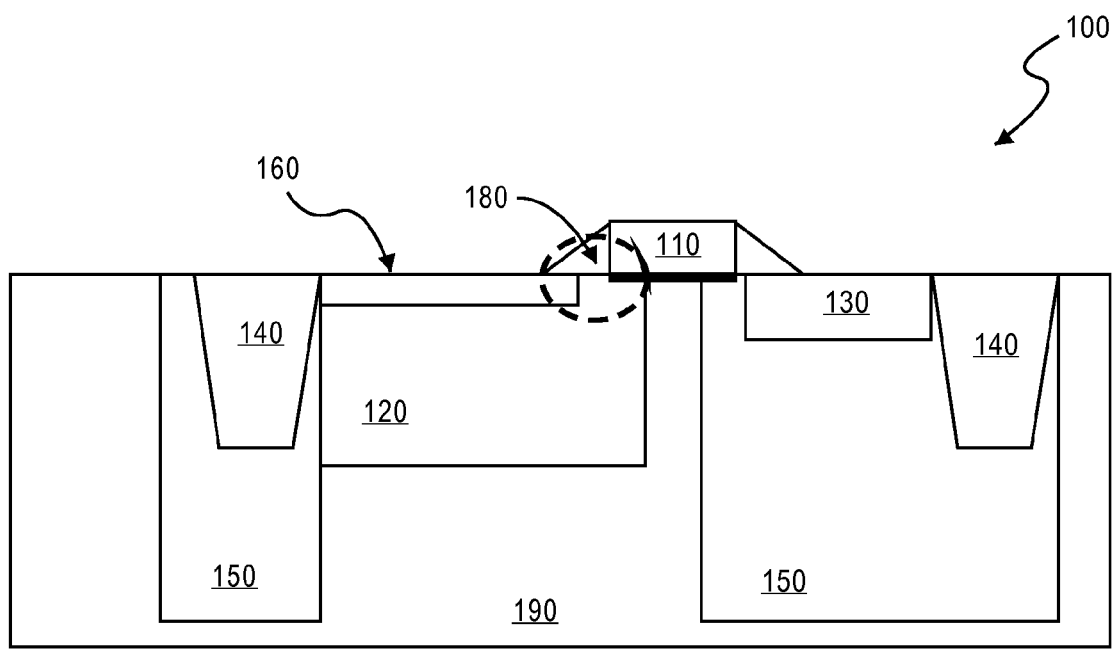
FIG. 1A is a cross section diagram of a conventional image pixel.

Embodiments of a globally reset image sensor pixels are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

In general, integrated circuits comprise circuitry that is employed for a variety of applications. The applications use a wide variety of devices such as logic devices, imagers (including CMOS and CCD imagers), and memory (such as DRAM and NOR- and NAND-based flash memory devices). These devices normally employ transistors for a variety of functions, including switching and amplification of signals.

Transistors are typically formed in integrated circuits by photolithographic processes that are performed on a silicon substrate. The processes include steps such as applying a photographic resist layer to the substrate, exposing the resist layer to a pattern using light (including deep ultra-violet wavelengths), removing the exposed portions (or non-exposed portions) of the photoresist by etching, and modifying the exposed structure, for example, by depositing or implanting additional materials to form various structure for electronic components (including transistors).

The term "substrate" includes substrates formed using semiconductors based upon silicon, silicon-germanium, germanium, gallium arsenide, and the like. The term substrate may also refer to previous process steps that have been performed upon the substrate to form regions and/or junctions in the substrate. The term substrate can also include various technologies, such as doped and undoped semiconductors, epitaxial layers of silicon, and other semiconductor structures formed upon of the substrate.

Chemical-mechanical planarization (CMP) can be performed to render the surface of the modified substrate suitable for forming additional structures. The additional structures can be added to the substrate by performing additional processing steps, such as those listed above.

When designing imaging pixels for CMOS image sensors, great care is often taken to maximize the fill factor of an imaging pixel (e.g., the ratio of the photodiode region to the total pixel region) and to maintain the symmetry of each pixel in sensor (with respect to other pixels in the sensor). Larger fill factors help to maximize the amount of light that is collected, while pixel symmetry helps to reduce fixed pattern noise and color shading. Fixed pattern noise can arise from design and/or process variations of each pixel among pixels in the pixel array of the image sensor. Color shading can arise from different frequency responses of pixels having different design geometries. Both the fill factor and in some cases pixel symmetry can be improved using the disclosed trench transfer gate (TX) design.

FIG. 1A is a cross section diagram of a conventional image pixel. Pixel 100 is typically formed in substrate 190. P-wells 150 can be formed using, for example, ion implantation or diffusion. Isolation regions 140 can be shallow-trench isolation structures or oxides formed by using local oxidation of silicon. Photodiode region 120 can be formed, for example by using a N-type implant. Region 160 is a pinning layer that can be optionally formed above photodiode region 120. Floating drain 130 can be formed using an N-type implant. Gate 110 can be formed by using an N-type material formed above an oxide layer such that a gate of a CMOS transistor is formed.

In operation, conventional image sensor 100 is exposed to incident light. The incident light is converted to electrons in photodiode (PD) region 120 via a photoelectric effect. The electrons are temporarily stored in the photodiode region 120. The transfer gate (TX) 110 is used to transfer the stored electrons from the photodiode region 120 to the floating drain (FD) 130, where the transferred electrons modify a preset voltage. The transfer gate 110 is typically a planar field effect transistor (FET). When the transfer gate 110 is turned on, an active channel is created underneath the transfer gate, which allows the electrons to flow from the photodiode region 120 to the floating drain 130.

The electrons flow through the overlap region 180 and the active channel generated by transfer gate 110 (under transfer gate 110). The region of overlap between the transfer gate and the photodiode region 120 facilitates the transport of electrons. If the region of overlap is too small, or there is no overlap, it is difficult to remove substantially all the electrons from the photodiode region 120; which results in the image lag as discussed above.

Figure 1B:
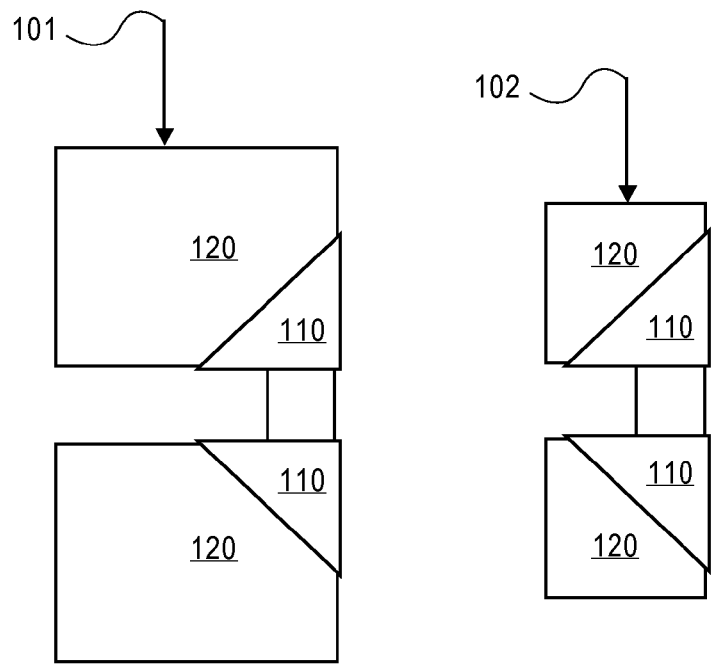
FIG. 1B illustrates overlap-induced limitation of conventional pixels.

The overlap of the transfer gate 110 reduces the surface region of photodiode 120, which in turn reduces the light collection region of the photodiode region 120. FIG. 1B illustrates overlap-induced limitation of conventional pixels. As shown in FIG. 1B, the overlap-induced limitation typically becomes increasingly more severe as pixel sizes (and the accompanying photodiode region) are increasingly reduced as advanced technologies become available. For example, the imaging pixels in pixel pair 101 have a substantially larger percentage of exposed photodiode region 120 to gate 110 region than the exposed photodiode region 120 to gate 110 of pixel pair 102. In addition, because of design rules that dictate a minimum space between adjacent transfer gates, the distance from the transfer gate to the closest edge of the photodiode, and the placement of transfer gate contacts (which are used to apply voltage to the transfer gates) also reduce the fill factor in the pixel.

Figure 1C:
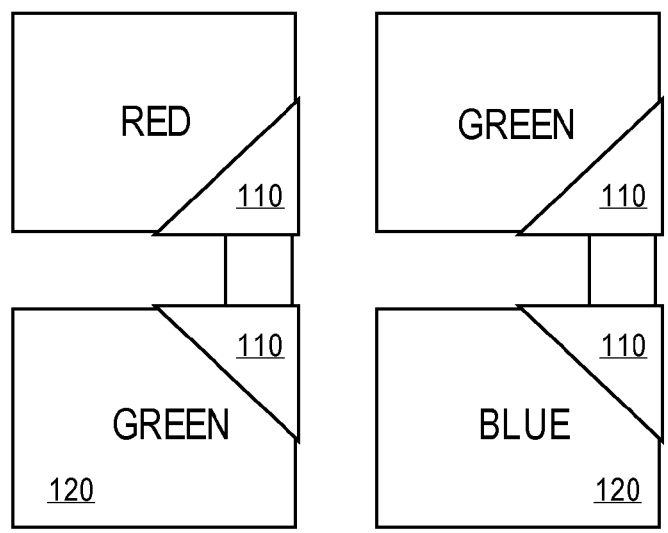
FIG. 1C illustrates a conventional transfer gate design in a shared pixel architecture.

FIG. 1C illustrates a conventional transfer gate design in a shared pixel architecture. (In a shared pixel architecture, two pixels are typically sampled using a floating drain that is coupled to the transfer gates of each of the two pixels.) Notwithstanding the apparent mirror symmetry of transfer gates 110, the transfer gates of the bottom row do not have the same orientation as the transfer gates of the top row. (For example the diagonal edge of gate 110 of the Red and upper Green pixels have a positive slope, while diagonal edge of gate 110 of the Blue and lower Green pixels have a negative slope.)

During color processing, the sampled values from each set of green, red, and blue photodiodes are overlaid (to generate an RGB pixel value for each pixel of an image, for example). However, the different transfer gate orientations in the photodiodes in the example often result in an image having skewed colors. Overlaying the colors thus can result in color shading, fixed pattern noise, and/or other imbalances in the image.

Figure 2A:
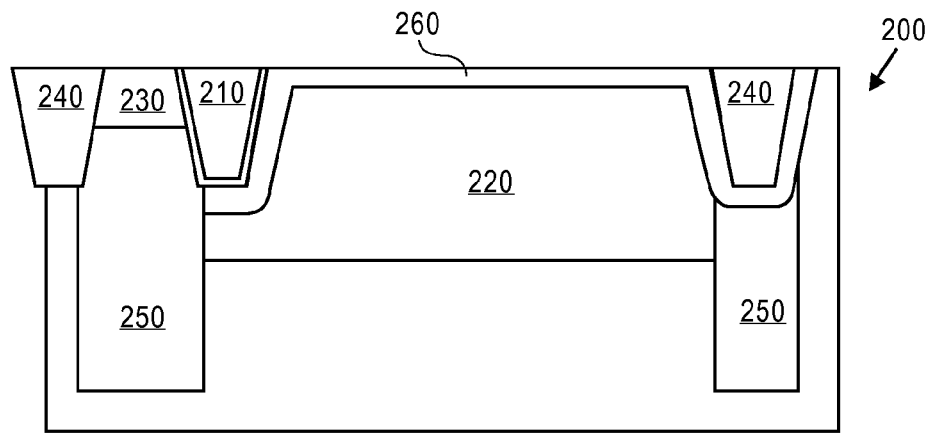
FIG. 2A illustrates a cross section of a pixel having a sample vertical transfer gate.

A vertical trench transfer gate for pixels is disclosed, which allows for increased fill factor and increased symmetry of pixels. FIG. 2A illustrates a cross section of a pixel having a sample vertical transfer gate. Pixel 200 includes a vertical transfer gate 210, a photodiode region 220, a floating drain 230, a shallow trench isolation region 240, a P-doped well region 250, and a surface P-type pinning region 260. Vertical transfer gate 210 is a vertical field effect device that is used as the transfer gate coupled between a photodiode region 220 and a floating drain 230 in an imaging pixel array. When vertical transfer gate 210 is activated, an active channel is established in a portion of P-type well region 250 that is between photodiode region 220 and the floating drain 230.

Figure 2B:
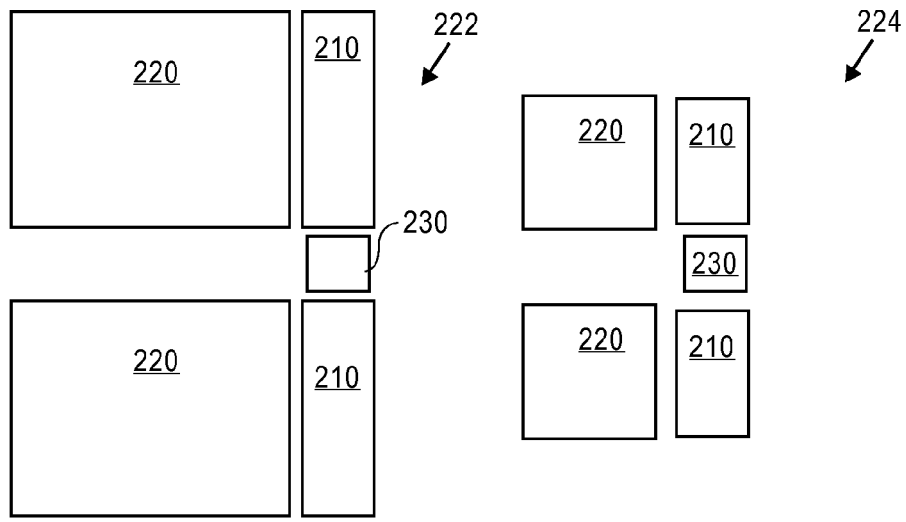
FIG. 2B is a top view of pixels having sample vertical transfer gates.

FIG. 2B is a top view of pixels having sample vertical transfer gates. The Figure illustrates, for example, a layout 222 of a two-shared pixel architecture drawn using larger design rules and a layout 224 of the two-shared pixel architecture drawn using smaller design rules. The Figure demonstrates a lack of detrimental scaling effects (as compared with FIG. 1B above) and a reduced, if any, transfer gate overlap (as compared with FIG. 1C above) that does not result in differing orientations of transfer gates between the upper and lower rows of shared pixels of layout 222 and/or layout 224.

Figure 2C:
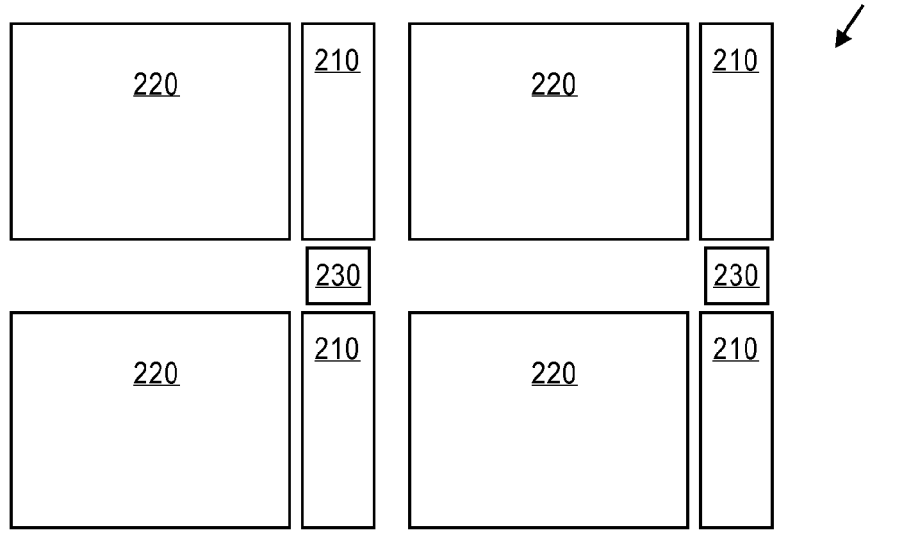
FIG. 2C is another top view of pixels having sample vertical transfer gates.

FIG. 2C is another top view of pixels having sample vertical transfer gates. The Figure illustrates, for example, a layout 226 of two columns of a two-shared pixel architecture drawn. The architecture demonstrates imaging pixel symmetry, a lack of transfer gate overlap, and regularity of design that is suited for scaling. Since no surface transfer gate is needed, symmetric photodiode regions can be formed such that red, green, and blue information from different imaging pixels is equalized. In contrast, conventional designs typically have photodiode regions that are not identical, which can lead to such problems as fixed pattern noise and color shading.

Figure 3A:
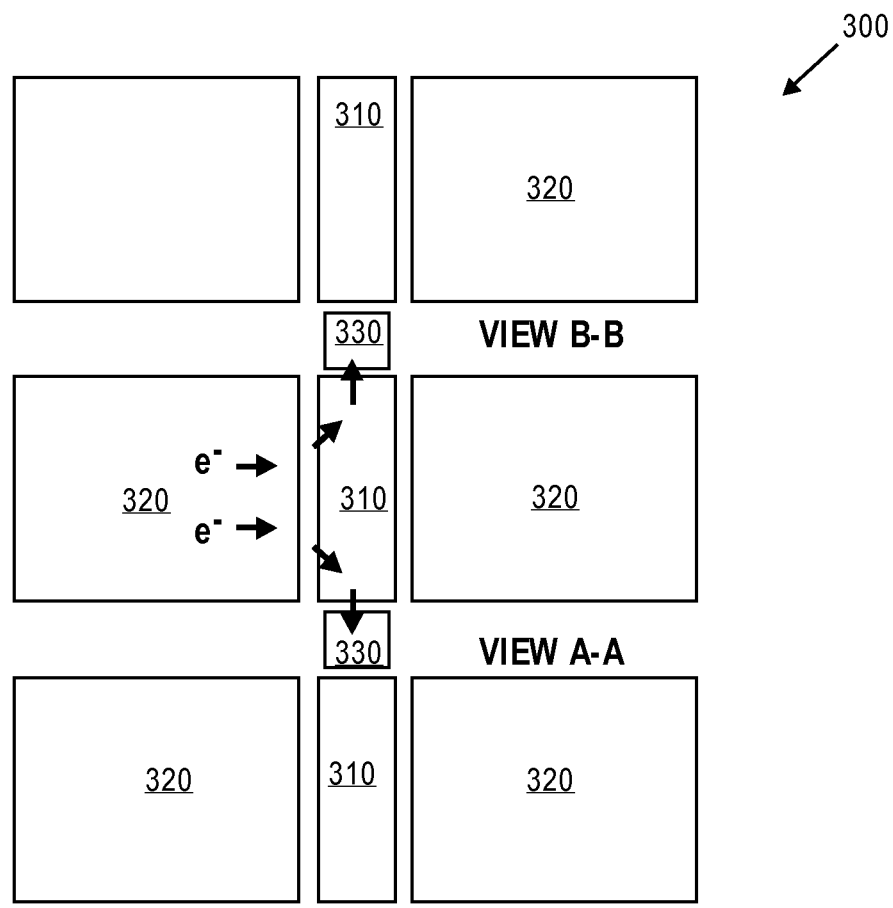
FIGS. 3A, 3B and 3C illustrates an array of pixels having vertical transfer gates.

FIG. 3A illustrates a top view of pixels having vertical transfer gates. As illustrated in the Figure, photodiode regions 320 are symmetrically arranged in rows and columns, where columns are separated by vertical (or "trench") transfer gates 310. Floating diffusion 330 regions are disposed between adjacent transfer gates 310.

A floating diffusion 330 region can be shared by adjacent pixels in a column. For example, a first vertical transfer gate can be activated to enable electron flow from a first pixel to a first pair of two floating diffusion regions. Subsequently, a second vertical transfer gate can be activated to enable electron flow from a first pixel to a second pair of two floating diffusion regions, wherein one floating diffusion region of the first pair of floating diffusion regions is one of the floating diffusion regions of the second pair of floating diffusion regions.

Pixel array 300 has increased electron transfer efficiency because opposing ends of a vertical transfer gate 310 can be applied to the same photodiode to empty the charge from the photodiode region 320 to one or more floating diffusions 330. Thus, image lag can be reduced because the charge produced in the photodiode region is more efficiently transferred. The efficiency is especially increased in photodiode regions having large full-well capacities and/or deep photodiode regions.

As further illustrated in FIG. 3A, vertical transfer gate 310 has an aspect ratio of other than unity. Thus, vertical transfer gate 310 has a length that is measured with respect to its longitudinal axis, where the length along the longitudinal axis is longer than the width of vertical transfer gate 310 (where the width is measured along an axis that is perpendicular to the longitudinal axis and that intersects each of two photodiode regions 320 on opposing sides of the vertical transfer gate 310). The longitudinal axis is substantially parallel to the adjacent side of the first photodiode region; substantially parallel can mean, for example, when the longitudinal axis intersects a floating diffusion region.

Thus, electrons flow in along a portion of the length of the vertical transfer gate 310 to opposing ends of the vertical transfer gate 310 in one embodiment. In another embodiment, electrons can flow along a portion of the length of the vertical transfer gate 310 to a first end of the vertical transfer gate 310, wherein the flow in along a portion of the length of the vertical transfer gate 310 to opposing ends of the vertical transfer gate 310 has a second end at which an isolation region can be disposed (as discussed further below).

Figures 3B, 3C:
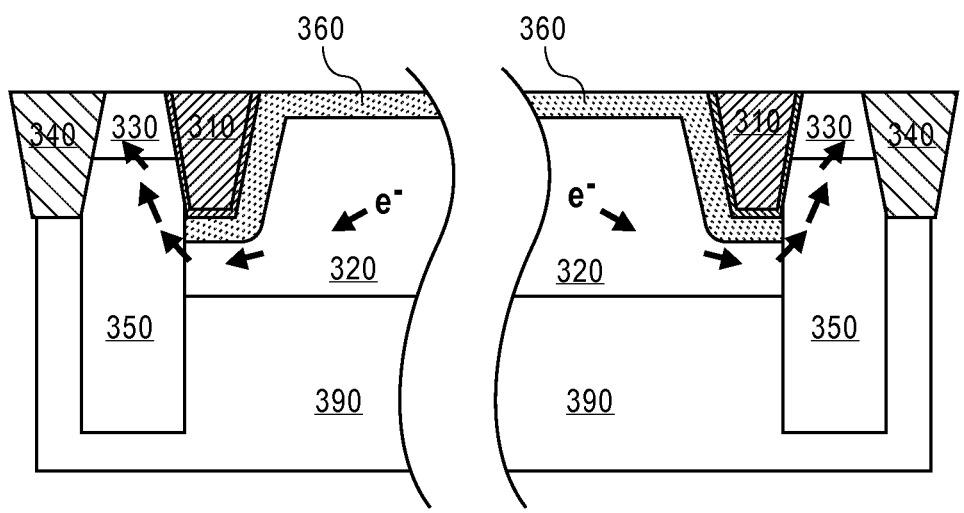

FIGS. 3B and 3C illustrate (diagonal) cross sections of a pixel having vertical transfer gates. FIGS. 3B and 3C are representative, for example, of each of the electron paths illustrated in FIG. 3A. A photodiode region 320 is formed within substrate 390. A P-type well 350 is provided to minimize dark current and to provide electrical continuity with floating diffusion 330. Shallow trench isolation 340 increases isolation between adjacent imaging pixels. Pinning layer 360 is typically of the same conductivity type as the substrate 390 and can be coupled to the substrate via P-type well 350.

In operation, electrons ("e$^-$") flow through the channel region formed by vertical transfer gate 310 and P-type well 350. The region having a common boundary between the transfer gate 310 and the photodiode region 320 facilitates the transport of electrons. If the common boundary is too small, or is nonexistent, it is difficult to remove substantially all the electrons from the photodiode region 320; which results in the image lag as discussed above. As shown in FIGS. 3B and 3C, two paths (e.g., the upper and lower electron paths illustrated in FIG. 1) are provided to more remove a substantial amount of electrons. (A substantial amount of electrons to be removed can be an amount that is greater than the amount of electrons that would otherwise be removed by using only one electron path, for example.)

The increased fill factor allows for increased quantum efficiency because of having a larger exposed photodiode region (for the same pixel size as conventional pixels because of the reduction in the overlap region). Because there is reduced transfer gate overlap, the photodiode is larger, which allows the full-well capacitance to be correspondingly larger.

Figure 4A:
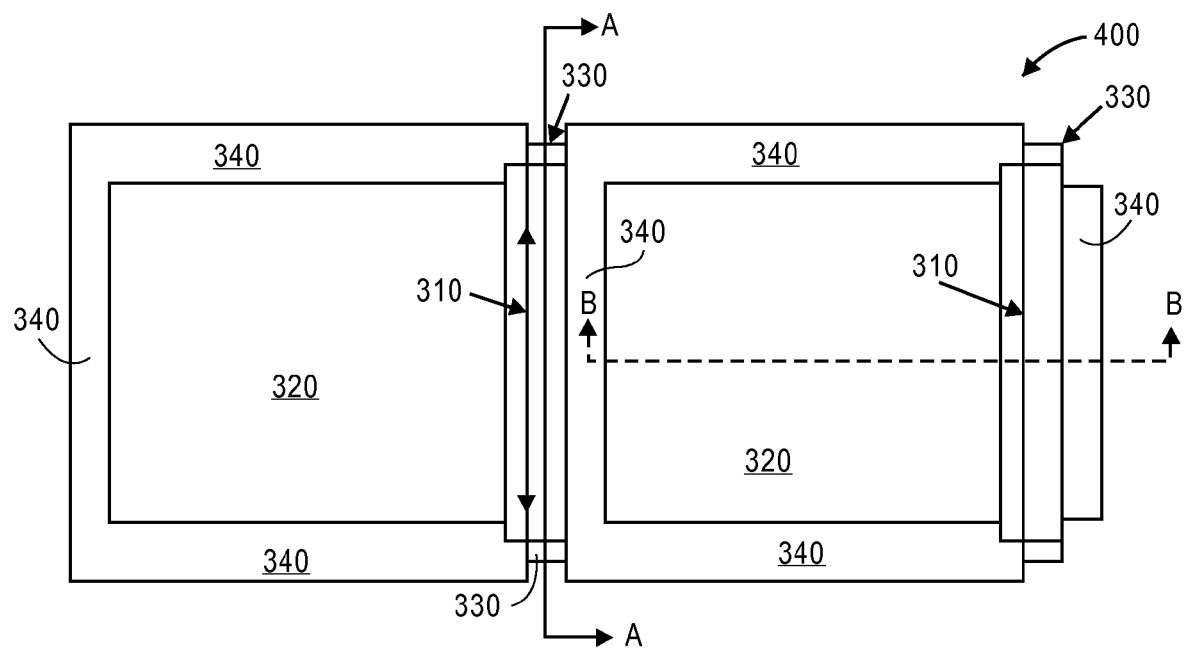
FIGS. 4A, 4B, 4C, and 4D illustrate pixels where each pixel has a single vertical transfer gate and a shared floating diffusion per pixel.

FIG. 4A illustrates a top view of pixels where each pixel has a single vertical transfer gate and a shared floating diffusion per pixel. Structure 400 illustrates a first pixel having a photodiode region 320 that has an isolation region 340 along three of the sides of the first photodiode region 320, while a first vertical transfer gate 310 is arranged along a fourth side of the first photodiode region 320. The first vertical transfer gate has at least one associated floating diffusion 330, although two associated floating diffusions are illustrated. The floating diffusion 330 regions are disposed between adjacent transfer gates 310 and can be shared as discussed above with respect to FIG. 3A. View lines A-A are illustrated in FIG. 4B, discussed below.

Structure 400 illustrates a second pixel having a photodiode region 320 that has an isolation region 340 along three of the sides of the first photodiode region 320, while a second vertical transfer gate 310 is arranged along a fourth side of the second photodiode region 320. View lines B-B are illustrated in FIG. 4C, discussed below.

Figure 4B:
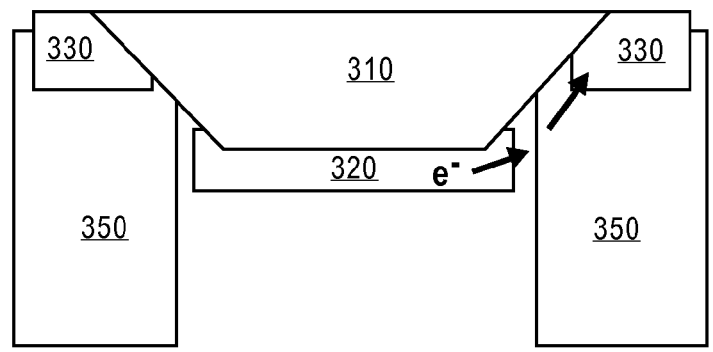

FIG. 4B illustrates a first cross-section view (view A-A) of FIG. 4A. As illustrated, the first photodiode region 320 has a portion that extends beneath the first vertical transfer gate 310. When the first vertical transfer gate 310 is activated, an active channel is formed along the length of the vertical transfer gate such that electrons can flow from the first photodiode region to either of the floating diffusion 330 regions. Thus, the electrons flow along a portion of the vertical transfer gate 310 in a direction away from the underneath portion of the vertical transfer gate 310.

Figure 4C:
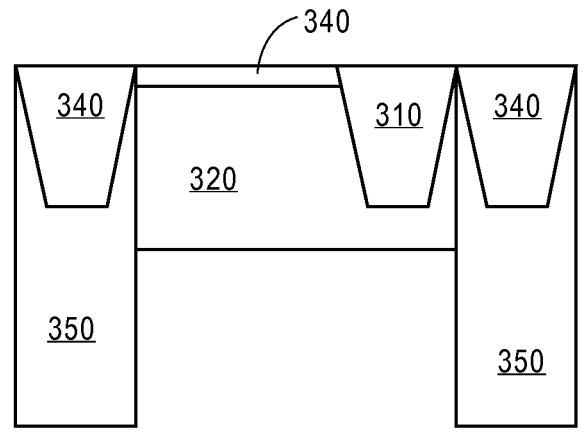

FIG. 4C illustrates a second cross-section view (view B-B) of FIG. 4A. As illustrated, the second photodiode region 320 has a portion that extends beneath the second vertical transfer gate 310 and horizontally across to P-type well 350. When the second vertical transfer gate 310 is activated, electrons in the formed active channel is formed along the length of the vertical transfer gate flow along the length of the vertical transfer gate 310, which in the illustration is perpendicular to the plane of the represented cross section.

Figure 4D:
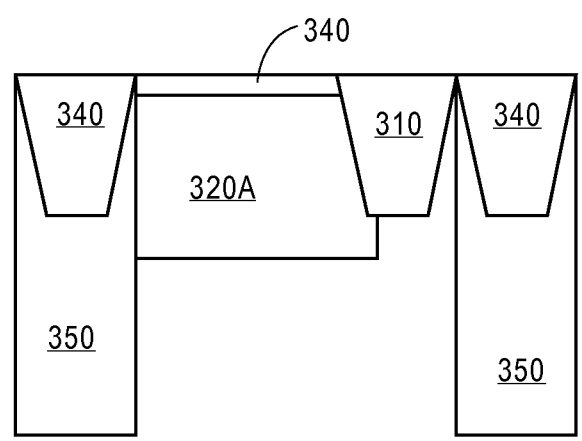

FIG. 4D illustrates a cross-section view of another embodiment of FIG. 4A. As illustrated, the second photodiode region 320A has a portion that extends only to a region beneath the second vertical transfer gate 310 so that the second photodiode region does not completely extend horizontally across to another structure such as P-type well 350. When the second vertical transfer gate 310 is activated, electrons in the formed active channel is formed along the length of the vertical transfer gate flow along the length of the vertical transfer gate 310, which in the illustration is generally perpendicular to the plane of the represented cross section.

Figure 5A:
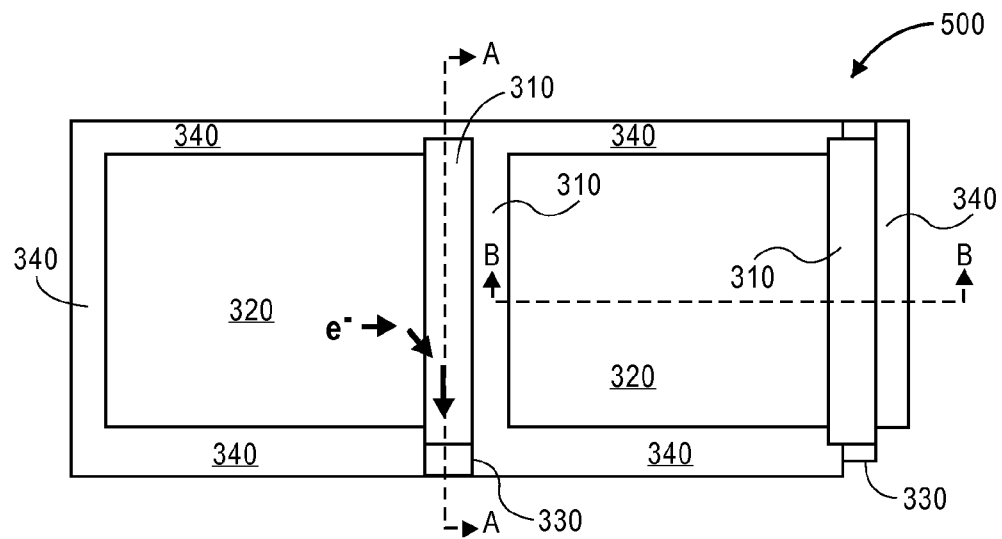
FIGS. 5A, 5B and 5C illustrates pixels where each pixel has a single vertical transfer gate and a single floating diffusion per pixel.
Figure 5B:
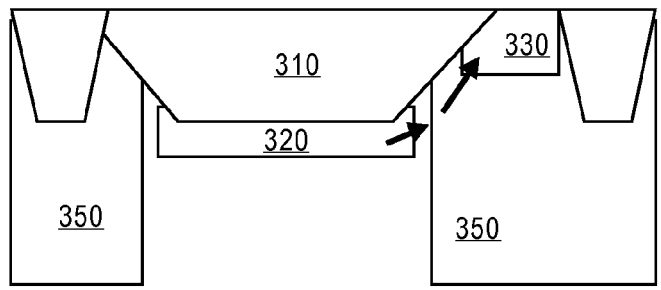

FIG. 5A illustrates a top view of pixels where each pixel has a single vertical transfer gate and a single floating diffusion per pixel. Structure 500 illustrates a first pixel having a photodiode region 320 that has an isolation region 340 along three of the sides of the first photodiode region 320, while a first vertical transfer gate 310 is arranged along a fourth side of the first photodiode region 320. The first vertical transfer gate has one associated floating diffusion 330. The floating diffusion 330 region associated with each of the first and second photodiode regions 320 is disposed adjacent to the vertical transfer gate 310 of the respective photodiode region 320. View lines A-A are illustrated in FIG. 5B, discussed below. View lines B-B are illustrated in FIG. 5C, discussed below.

FIG. 5B illustrates a first cross-section view (view A-A) of FIG. 5A. As illustrated, the first photodiode region 320 has a portion that extends beneath the first vertical transfer gate 310. When the first vertical transfer gate 310 is activated, an active channel is formed along the length of the vertical transfer gate such that electrons can flow from the first photodiode region to the floating diffusion 330 region. Thus, the electrons flow along a portion of the vertical transfer gate 310 in a direction away from the underneath portion of the vertical transfer gate 310.

Figure 5C:
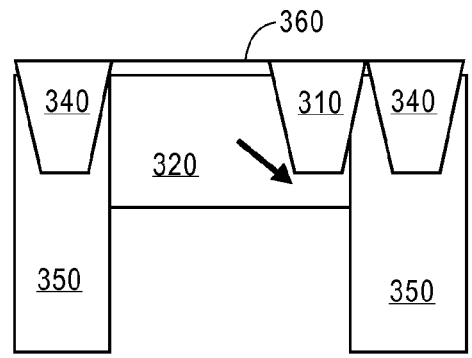

FIG. 5C illustrates a second cross-section view (view B-B) of FIG. 5A. As illustrated, the second photodiode region 320 has a portion that extends beneath the second vertical transfer gate 310 and horizontally across to P-type well 350. When the second vertical transfer gate 310 is activated, electrons in the formed active channel (formed along the length of the vertical transfer gate) flow along the length of the vertical transfer gate 310, which in the illustration is perpendicular to the plane of the represented cross section.

FIG. 6A illustrates a top view of pixels having a shared vertical transfer gate and shared floating diffusion per pixel. Structure 600 illustrates a first pixel having a photodiode region 320 that has an isolation region 340 along three of the sides of the first photodiode region 320, while a first vertical transfer gate 310 is arranged along a fourth side of the first photodiode region 320. The first vertical transfer gate has at least one associated floating diffusion 330, although two associated floating diffusions are illustrated. The floating diffusion regions 330 (when both are present) are disposed at opposite ends along the lengths of vertical transfer gates 310 and are shared with a second pixel. View lines A-A are illustrated in FIG. 6B, discussed below.

The second pixel is illustrated as having a second photodiode region 320 that has an isolation region along three of the sides of the second photodiode region 320, while the first vertical transfer gate 310 is arranged along the fourth side of the second photodiode region 320. Thus, when the first vertical transfer gate 310 is activated, electrons flow from each photodiode region 320 along the length of the first vertical transfer gate 310. View lines B-B are illustrated in FIG. 6C, discussed below.

The third pixel is illustrated as having a third photodiode region 320 that has an isolation region 340 along three of the sides of the third photodiode region 320, where the isolation region 340 is arranged between the second and third photodiode regions 320

FIG. 6B illustrates a first cross-section view (view A-A) of FIG. 6A. As illustrated, the first photodiode region 320 has a portion that extends beneath the first vertical transfer gate 310. When the first vertical transfer gate 310 is activated, an active channel is formed along the length of the vertical transfer gate such that electrons can flow from the first photodiode region to either of the floating diffusion 330 regions. Thus, the electrons flow along a portion of the vertical transfer gate 310 in a direction away from the underneath portion of the vertical transfer gate 310.

FIG. 6C illustrates a second cross-section view (view B-B) of FIG. 6A. As illustrated, the first and second photodiode regions 320 each has a portion that extends beneath the first vertical transfer gate 310 and horizontally across to a P-type well 350. When the first vertical transfer gate 310 is activated, electrons in the formed active channel (formed along the length of the vertical transfer gate) flow along the length of the vertical transfer gate 310, which in the illustration is perpendicular to the plane of the represented cross section.

Figure 7:
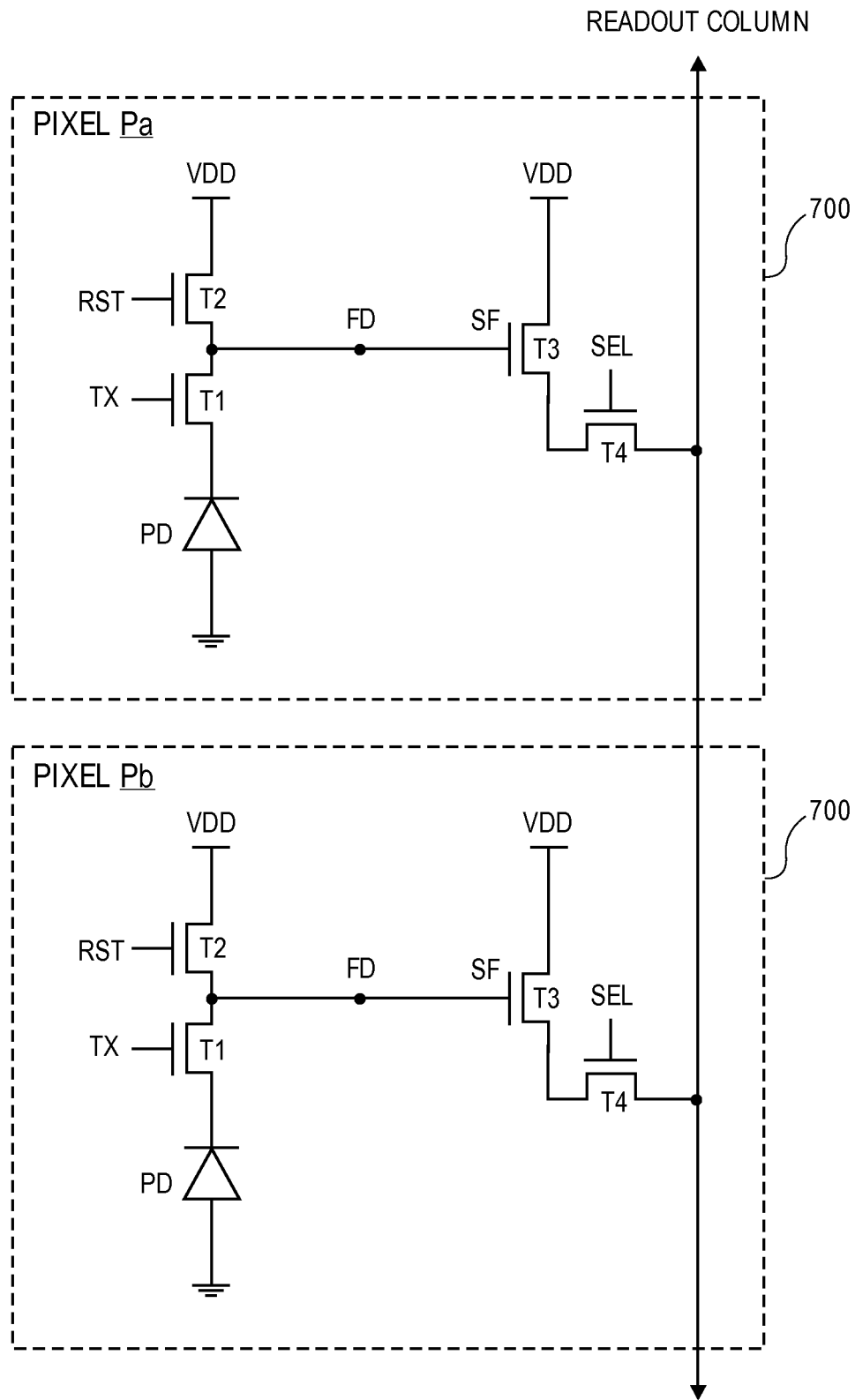
FIG. 7 is a circuit diagram illustrating pixel circuitry of two four-transistor ("4T") pixels within an imaging array, in accordance with an embodiment of the invention.

FIG. 7 is a circuit diagram illustrating pixel circuitry 700 of two four-transistor ("4T") pixels within an imaging array, in accordance with an embodiment of the invention. Pixel circuitry 700 is but one possible pixel circuitry architecture for implementing pixels within pixel array 300 of FIG. 3. However, it should be appreciated that embodiments of the present invention are not limited to 4T pixel architectures; but that 5T designs, and various other pixel architectures can be used.

In FIG. 7, pixels Pa and Pb are arranged in two rows and one column. (The imaging array comprising pixels Pa and Pb often contains hundreds of rows and columns.) The illustrated embodiment of each imaging pixel circuitry 700 includes a photodiode PD, a transfer transistor T1, a reset transistor T2, a source-follower ("SF") transistor T3, and a select transistor T4. During operation, transfer transistor T1 receives a transfer signal TX, which transfers the charge accumulated in photodiode PD to a floating diffusion node FD.

Reset transistor T2 is coupled between a power rail VDD and the floating diffusion node FD to reset (e.g., discharge or charge the FD to a preset voltage) under control of a reset signal RST. The floating diffusion node FD is coupled to the gate of SF transistor T3. SF transistor T3 is coupled between the power rail VDD and select transistor T4. SF transistor T3 operates as a source-follower providing a high impedance output from floating diffusion node FD. Finally, select transistor T4 selectively couples the output of imaging pixel circuitry 700 to the readout column line under control of a select signal SEL. In one embodiment, the TX signal, the RST signal, and the SEL signal are generated by control circuitry 120. The TX signal, the RST signal, the SEL signal, VDD, and ground may be routed in imaging pixel circuitry 700 by way of metal interconnect layers M1 and M2. In one embodiment, transistors T1, T2, T3, and T4, photodiode PD and floating diffusion node FD may be connected as shown in FIG. 7 by way of metal interconnect layers M1 and M2.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor, comprising:
a first imaging pixel having a first photodiode region disposed within a substrate of the image sensor;
a vertical transfer transistor disposed along a first side of the first photodiode region, the vertical transfer transistor having a longitudinal axis that is substantially parallel to the first side of the first photodiode region;
a first floating diffusion region disposed along the longitudinal axis at a first end of the vertical transfer transistor, wherein the transfer transistor is arranged to form when activated a first active channel along the vertical transfer transistor, wherein the first active channel is parallel to the longitudinal axis, and wherein the first active channel couples the first photodiode region to the first floating diffusion region; and
a second floating diffusion region disposed along the longitudinal axis at a second end of the vertical transfer transistor opposite the first end, wherein a second active channel is formed along the vertical transfer transistor parallel to the longitudinal axis and couples the first photodiode region to the second floating diffusion region when the vertical transfer transistor is activated, wherein charge carriers flow in opposite directions in the first and second active channels,
wherein the longitudinal axis of the vertical transfer transistor intersects the first and second floating diffusion regions at the first and second ends of the vertical transfer transistor.

2. The apparatus of claim 1, wherein the photosensitive region comprises a diode formed by an N-well in a P-type substrate.

3. The apparatus of claim 1, further comprising a second imaging pixel having a second photodiode region disposed within the substrate of the image sensor.

4. The apparatus of claim 3, further comprising an isolation structure disposed between the second photodiode region and the vertical transfer transistor.

5. The apparatus of claim 4, wherein the first photodiode region extends only to a region beneath the vertical transfer transistor.

6. The apparatus of claim 4, wherein the first photodiode region extends beneath the vertical transfer transistor.

7. The apparatus of claim 4, wherein the second imaging pixel is disposed along a side of the isolation region.

8. The apparatus of claim 3, wherein first photodiode region is disposed along a first side of the vertical transfer transistor and the second photodiode region is disposed along a second side of the vertical transfer transistor opposite the first side.

9. The apparatus of claim 8, further comprising a second floating diffusion region disposed along the longitudinal axis at a second end of the vertical transfer transistor, wherein the first and second imaging pixels share the vertical transfer transistor and share the first and second floating diffusion regions via the vertical transfer transistor.

10. The apparatus of claim 1, wherein the imaging pixels of the image sensor are two-shared.

11. The apparatus of claim 10, wherein the imaging pixels of the image sensor are four-shared.

12. A method, comprising:
exposing a first photodiode region of an imaging pixel to light to generate electrons in the photodiode region;
activating a gate of a transfer transistor disposed along a first side of the first photodiode region to cause generated electrons to flow from the first photodiode region, wherein the first transfer transistor has a longitudinal axis that is substantially parallel to the first side of the first photodiode region, wherein the electrons flow through an active channel that is substantially parallel to the longitudinal axis of the transfer transistor, and flow to first and second floating diffusion regions disposed at first and second ends of the transfer transistor, wherein the generated electrons flow in opposite directions along the active channel to the first and second floating diffusions, wherein the longitudinal axis of the transfer transistor intersects the first and second floating diffusion regions at the first and second ends of the transfer transistor;
coupling the first floating diffusion region to the gate of a source follower transistor; and
coupling the output of the source follower transistor to a readout column line under control of a select signal.

13. The method of claim 12, wherein activating the gate of the transfer transistor causes electrons to flow to the first floating diffusion region and to the second floating diffusion area concurrently.

14. The method of claim 13, wherein activating the gate of the transfer transistor causes electrons to flow from a second photodiode region, concurrently with the electrons flowing from the first photodiode region, into the first and second floating diffusion regions via the transfer transistor.

15. The method of claim 12, wherein the imaging pixel is in a pixel array.

16. An electrical device, comprising:
a first photodiode region disposed within a substrate of the image sensor;
a first vertical transfer transistor having an input coupled to the first photodiode region, wherein the first vertical transfer transistor has a longitudinal axis that is substantially parallel to the first side of the first photodiode region;
a first floating diffusion region disposed along the longitudinal axis at a first end of the first vertical transfer transistor, wherein the transfer transistor is arranged to form when activated an active channel along the longitudinal axis of the first vertical transfer transistor;
a second floating diffusion region disposed along the longitudinal axis at a second end of the vertical transfer transistor opposite the first end, wherein a second active channel is formed along the vertical transfer transistor parallel to the longitudinal axis and couples the first photodiode region to the second floating diffusion region when the vertical transfer transistor is activated, wherein charge carriers flow in opposite directions in the first and second active channels; and
an isolation structure disposed between the first vertical transfer transistor and a second photodiode region,
wherein the longitudinal axis of the vertical transfer transistor intersects the first and second floating diffusion regions at the first and second ends of the vertical transfer transistor.

17. The apparatus of claim 16, wherein the device is a logic device, CMOS imager, or CCD imager.

18. The apparatus of claim 16, further comprising a source follower transistor having a gate coupled to the first floating diffusion.

19. The apparatus of claim 16, further comprising an isolation region disposed at a second end of the first vertical transfer transistor.

* * * * *